United States Patent [19]
Shigeno

[11] Patent Number: 5,353,294
[45] Date of Patent: Oct. 4, 1994

[54] SEMICONDUCTOR LASER DEVICE AND SEMICONDUCTOR LASER MODULE

[75] Inventor: Kazuo Shigeno, Tokyo, Japan

[73] Assignee: NEC Corporation, Japan

[21] Appl. No.: 954,157

[22] Filed: Sep. 30, 1992

[30] Foreign Application Priority Data

Oct. 2, 1991 [JP] Japan .................. 3-254041

[51] Int. Cl.5 .................. H01S 3/18; G02B 6/26
[52] U.S. Cl. .................. 372/43; 372/50; 385/52; 385/34; 385/90; 385/93
[58] Field of Search .................. 385/88, 89, 90, 91, 385/92, 93, 94, 33, 34, 52, 14; 372/43, 44, 49, 50

[56] References Cited

U.S. PATENT DOCUMENTS

| | | | |
|---|---|---|---|
| 4,399,453 | 8/1983 | Berg et al. | 385/93 X |
| 4,403,243 | 9/1983 | Hakamada | 385/94 X |
| 4,707,067 | 11/1987 | Haberland et al. | 385/93 X |
| 4,746,195 | 5/1988 | Auracher et al. | 385/52 X |
| 4,790,618 | 12/1988 | Abe | 385/93 X |
| 5,074,682 | 12/1991 | Uno et al. | 385/93 |
| 5,087,109 | 2/1992 | Ishizuka et al. | 385/52 X |
| 5,107,537 | 4/1992 | Schriks et al. | 385/91 |
| 5,127,075 | 6/1992 | Althaus et al. | 385/94 |
| 5,191,629 | 3/1993 | Kaiser | 385/93 X |
| 5,283,802 | 2/1994 | Hsiung | 372/43 X |
| 5,297,218 | 3/1994 | Hanaoka | 372/43 X |

FOREIGN PATENT DOCUMENTS 1-147509  6/1989  Japan .................. 385/52 X Primary Examiner—Brian Healy
Attorney, Agent, or Firm—Laff, Whitesel, Conte & Saret

[57] ABSTRACT

According to this invention, a semiconductor laser device includes a coaxial package and a semiconductor laser chip. The semiconductor laser chip is incorporated in the package such that an emission position of the semiconductor laser chip is shifted from an axis of the package.

4 Claims, 2 Drawing Sheets

SEMICONDUCTOR LASER DEVICE AND SEMICONDUCTOR LASER MODULE

BACKGROUND OF THE INVENTION

The present invention relates to a semiconductor laser device and a module having an optical fiber and, more particularly, to a module which is free from an influence of a reflected beam at an optical fiber end face and decreases a coupling loss.

When a compact semiconductor laser module, especially, a module using no refrigeration by a Peltier element is to be formed, the following scheme is used. That is, a semiconductor laser chip and a monitoring photodiode chip are sealed in a compact CAN package having a diameter of 5.6 mm in advance, and the resultant structure is screened as a semiconductor laser device. Thereafter, it is incorporated in a holder to which a lens is fixed, and the optical axis of an optical fiber is adjusted and fixed, thereby obtaining a module having the optical fiber.

FIG. 4 shows a conventional semiconductor laser module. A stem 3 having a diameter of 5.6 mm is popularly applied to a pick up semiconductor laser device for an optical disk and considered as one of the standards. This is one reason for popularly using the module structure shown in FIG. 4.

The semiconductor laser module shown in FIG. 4 has the following structure. In the structure, a lens 5 and an optical fiber 7 which are opposite to each other in an axial direction are fixed to a lens holder 6, and a semiconductor laser device 20 is fixed to the lens holder 6 so that axes 10 thereof coincide with each other.

In the semiconductor laser device 20, a semiconductor laser chip 1 is fixed to the stem 3 through a heat sink 2 for radiating heat generated by the semiconductor laser chip 1, and they are hermetically sealed by a cap 4 having a window. The light emitting position of the semiconductor laser chip 1 is on an axis 10 of the stem 3.

When a radiation beam of the semiconductor laser chip 1 is reflected by an optical fiber end face 7a and returned to a semiconductor laser cavity, a mode stability of the semiconductor laser becomes unstable to cause noise appearance for transmission. For this reason, the semiconductor laser module is generally designed to prevent the reflected beam at the optical fiber end face 7a from being returned to the semiconductor laser chip 1. In FIG. 4, the optical fiber end face 7a is polished at an angle of about 9°. In this case, an optical beam radiated from the semiconductor laser chip 1 is focused by the lens 5 to form a beam waist. If the optical fiber end face 7a is positioned at the beam waist, the mode of the optical beam is converted into a mode which transmits through the optical fiber 7. At this time, although a reflected return beam is produced at the optical fiber end face 7a at a reflectivity of about 4%, since the optical fiber end face 7a has an inclination angle of about 9°, the reflected return beam is incident at a large angle on a facet of the semiconductor laser chip 1. Therefore, the level of the beam coupled to the intrinsic mode of the semiconductor laser chip 1 is to be very low. For this reason, the operation state of the semiconductor laser chip 1 is not disturbed by the reflected return beam.

In the conventional semiconductor laser module, since the optical fiber end face 7a is inclined at an angle of about 9° to suppress the influence of a reflected return beam, the beam which is incident on the optical fiber 7 is not parallel to the axis of the optical fiber 7, i.e., an excessive coupling loss is inevitable. In the semiconductor laser module in FIG. 4, the coupling loss is about 7 dB, 3 dB of the coupling loss correspond to an excessive loss caused by polishing the end face with an inclination. This is a major problem when a compact and high-output semiconductor laser module is to be formed.

SUMMARY OF THE INVENTION

It is an object of the present invention to provide a semiconductor laser device and a semiconductor laser module which are free from an excessive coupling loss caused by the inclined end face of an optical fiber.

It is another object of the present invention to provide a semiconductor laser device and a semiconductor laser module which are free from an influence of a return beam reflected by an optical fiber end face.

In order to achieve the above objects, according to the present invention, there is provided a semiconductor laser device comprising a coaxial package and a semiconductor laser chip incorporated in the package such that an emission position of the semiconductor laser chip is shifted from an axis of the package.

DESCRIPTION OF THE PREFERRED EMBODIMENTS

Figure 1:
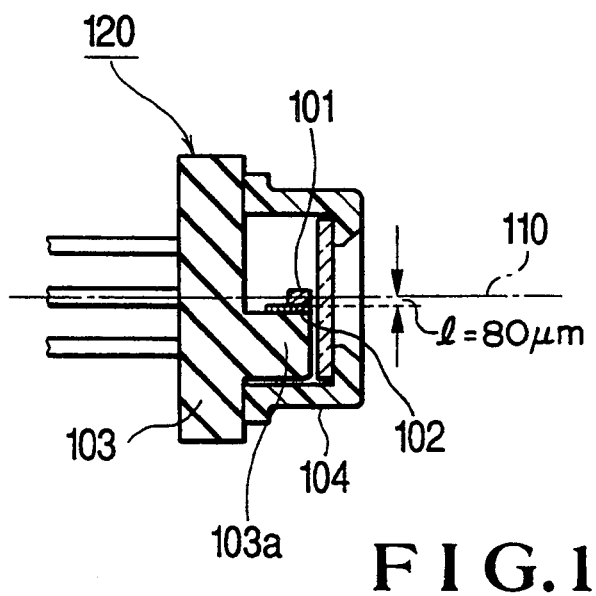
FIG. 1 is a sectional view showing a semiconductor laser device according to an embodiment of the present invention.
Figure 4:
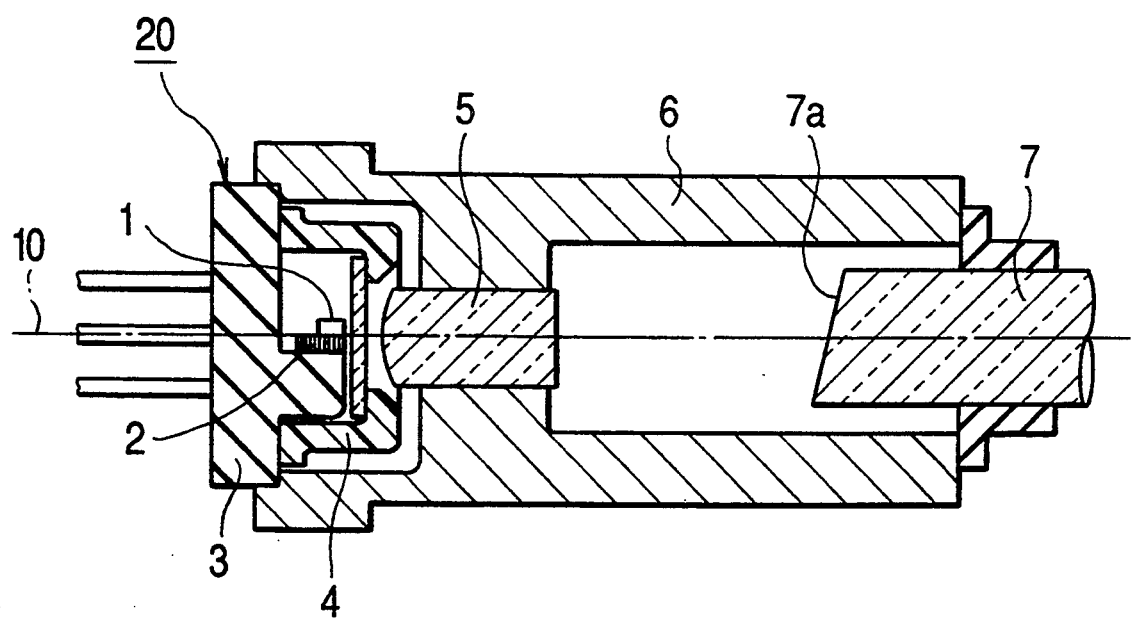
FIG. 4 is a sectional view showing a conventional semiconductor laser module.

The present invention will be described below with reference to the accompanying drawings. FIG. 1 shows a semiconductor laser device according to an embodiment of the present invention. A semiconductor laser chip 101, a stem 103 having a diameter of 5.6 mm, and a cap 104 are the same as those of the prior art in FIG. 4. In the prior art, the heat sink 2 has a thickness of 300 $\mu$m. In this case, the sub-mount portion of the stem 3 is designed such that the emission point of the semiconductor laser chip 1 coincides with the axis 10 on a reference surface of the stem 3 having an outer diameter of 5.6 mm. In the present invention, a heat sink 102 having a thickness of 220 $\mu$m is used, and the emission point of the semiconductor laser chip 101 is accurately shifted from a stem axis 110 in a direction of vertical radiation angle by $l = 80$ $\mu$m.

Figure 2:
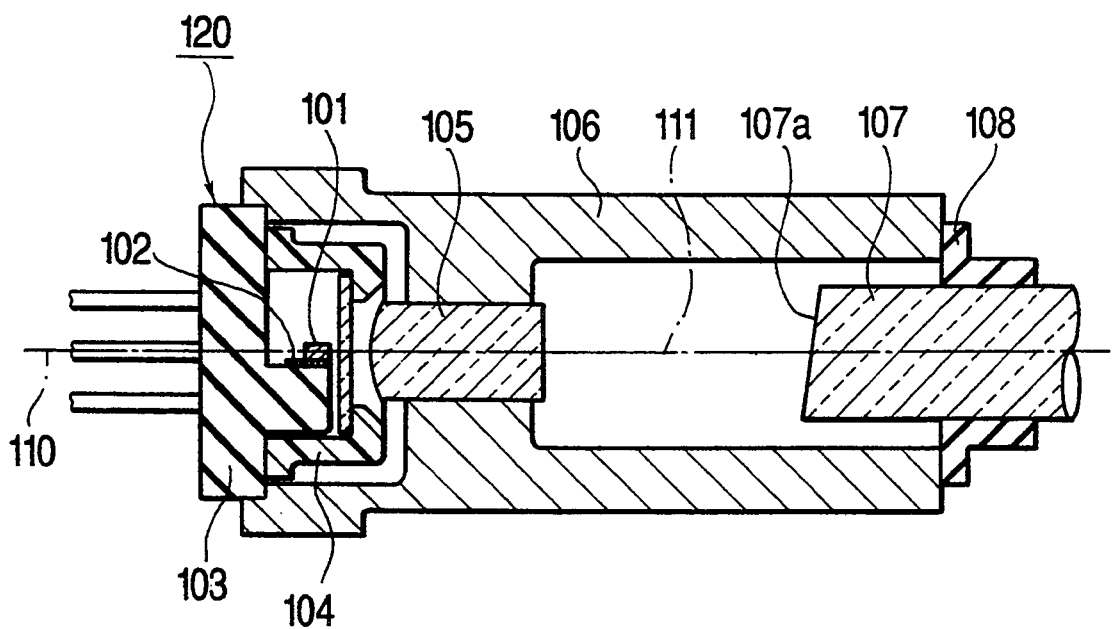
FIG. 2 is a sectional view showing a semiconductor laser module according to another embodiment of the present invention.
Figure 3:
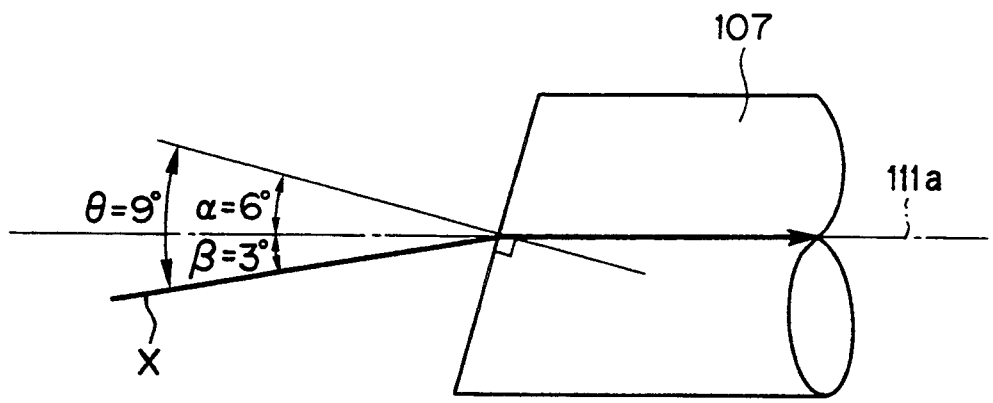
FIG. 3 is view for explaining an optical path of an optical beam of the semiconductor laser module in FIG. 2.

FIG. 2 shows a semiconductor laser module according to another embodiment of the present invention, FIG. 3 explains an optical path for an optical beam. A semiconductor laser chip 101, a heat sink 102, a stem 103, and a cap 104 are the same as those of a semiconductor laser device 120 in the previous embodiment of the present invention. As a lens 105, a plano-convex SELFOC lens is used. The lens 105 is fixed to a lens holder 106 such that the axis of the lens 105 coincides with an axis 111 of the lens holder 106. The semiconductor laser device 120 is fixed to the lens holder 106 such that the axes thereof coincide with each other. Therefore, the emission point of the semiconductor laser chip 101 is shifted from the optical axis of the lens 105 by 80 μm. For this reason, an optical beam emitted from the lens 105 is not parallel to the optical axis of the lens 105, and the optical beam is inclined at an angle of 3°. In this embodiment, an optical fiber 107 is a single-mode fiber and fixed to the lens holder 106 through a slide ring 108. An optical fiber end face 107a is inclined at an angle of 6°, and the axis of the optical fiber coincides with the axis 111 of the lens 105 and the lens holder 106. As shown in FIG. 3, when the inclination of $\alpha = 6°$ of the optical fiber end face 107a is opposite to the incident direction of $\beta = 3°$ of the optical beam, an incident beam X having a relative angle of $\theta = 9°$ coincides with an axis 111a of the optical fiber having a relative angle of 3° after the incident beam X is refracted at the optical fiber end face into transmission mode through the optical fiber, and an excessive loss is not caused. In addition, the incident angle of a reflected return beam to the semiconductor laser chip 101 becomes larger than that of the prior art in FIG. 4 by twice or more because the emission position of the semiconductor laser chip is shifted from the axis of the lens, and the level of a return beam amount is decreased by 8 dB or more. As a result, a coupling loss of 4 dB could be achieved in the semiconductor laser module in FIG. 2, and the coupling loss of the semiconductor laser module in FIG. 2 could be lower by an excessive coupling loss of 3 dB than that of the semiconductor laser module of the prior art in FIG. 4.

As described above according to the present invention, the emission point of a semiconductor laser chip is positioned to be shifted from the axis of a coaxial CAN package, and a countermeasure against a reflected returned beam, i.e., an optical fiber end face polished with an inclination, is used. In this state, when a combination of inclination angles is changed, a decrease in excessive coupling loss and a decrease in reflected return beam amount can be simultaneously achieved.

What is claimed is:

1. A semiconductor laser device comprising:
   a coaxial package having an axis which coincides with an axis of an optical fiber coupled thereto;
   a stem, coupled into said package, having a sub-mount portion for incorporating said semiconductor chip, an upper surface of said sub-mount portion being formed to be shifted in a radial direction away from the axis of said package;
   a heat-radiation heat sink arranged on the upper surface of said sub-mount portion; and
   a semiconductor laser chip, incorporated on said heat sink, having an emission position which is a position for emitting a laser beam, said emission position being set to be vertically shifted in a radial direction away from the axis of said package by a thickness of said heat sink in order to decrease a coupling loss.

2. A device according to claim 1, wherein said package in which said semiconductor laser chip is incorporated is hermetically sealed, and said package has a window in a center axial direction for transmitting a radiation beam emitted from said semiconductor laser chip.

3. A semiconductor laser module comprising:
   a semiconductor laser chip incorporated on a heat sink having an emission position which is a position for emitting a laser beam, said emission position being set to be vertically shifted in the radial direction away from the axis of said package by a thickness of said heat sink in order to decrease a coupling loss;
   a lens for focusing a radiation beam emitted from said semiconductor laser chip;
   an optical fiber having an inclined end face for decreasing the amount of a reflected return of said beam, the optical beam being focused on said inclined end face by said lens; and
   a coaxial holder for holding said lens and said optical fiber on the same axis, said coaxial holder being coupled to said coaxial package of said semiconductor laser device so that an axis of said coaxial holder coincides with an axis of said coaxial package.

4. A module according to claim 3, wherein said semiconductor laser device and said optical fiber are coupled to each other so that an incident direction of the optical beam emanating from said lens is opposite to the inclination of the end face of said optical fiber, so that the optical beam refracted at the end face of said optical fiber coincides with the axis of said optical fiber.

* * * * *